United States Patent
Wurster

[11] Patent Number: 5,823,830
[45] Date of Patent: Oct. 20, 1998

[54] TAILESS COMPLIANT CONTACT

[76] Inventor: Woody Wurster, 502 W. Robinson, Carson City, Nev. 89703

[21] Appl. No.: 394,409

[22] Filed: Feb. 24, 1995

[51] Int. Cl.⁶ .................................................... H02R 13/42
[52] U.S. Cl. ............................................. 439/751; 439/78
[58] Field of Search .................................. 439/78, 79, 81, 439/82, 751, 851

[56] References Cited

U.S. PATENT DOCUMENTS

| | | | |
|---|---|---|---|
| 4,575,167 | 3/1986 | Minter | 439/83 |
| 4,686,607 | 8/1987 | Johnson | 439/81 |
| 4,735,587 | 4/1988 | Kirayoglu | 439/751 |
| 4,737,114 | 4/1988 | Yaegashi | 439/82 |
| 4,749,357 | 6/1988 | Foley | 439/78 |
| 4,769,907 | 9/1988 | Sebastein | 439/82 |
| 4,824,380 | 4/1989 | Matthews | 439/78 |
| 5,038,252 | 8/1991 | Johnson | 439/82 |
| 5,078,612 | 1/1992 | Rozmus | 439/751 |
| 5,090,912 | 2/1992 | Zell | 439/79 |
| 5,106,328 | 4/1992 | Prochaska et al. | 439/751 |

FOREIGN PATENT DOCUMENTS

| | | |
|---|---|---|
| 0451674A1 | 4/1991 | European Pat. Off. . |

*Primary Examiner*—P. Austin Bradley
*Assistant Examiner*—T. C. Patel
*Attorney, Agent, or Firm*—Freilich Hornbaker Rosen

[57] ABSTRACT

An electrical contact is provided for press-fit insertion into a circuit board, which has a minimal antenna effect in radiating or receiving high frequency signals, while providing a large retention force (resistance to pullout). A compliant section (20, FIG. 4) of the contact is of the eye-of-the-needle type which includes a vertically-extending slot (44) that leaves a pair of largely vertical beams (46, 48) having outer sides (54) lying furthest from the slot. The lower portion (30) of the compliant section extends a small distance (N) below the bottom of the vertical slot, and is rounded to a radius of curvature (A) that is at least twenty percent of the maximum horizontal distance (G) between the outer sides of the beams, to produce a gradually rounded surface that minimizes radiation emission and reception. The outer sides of the beams are convexly rounded at a large radius of curvature (J) which is greater than the maximum distance (G) between the outer sides of the beams, to provide a large area of contact with the walls of the circuit board hole.

8 Claims, 2 Drawing Sheets

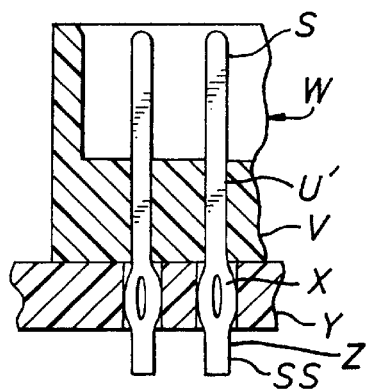
FIG. 1
PRIOR ART
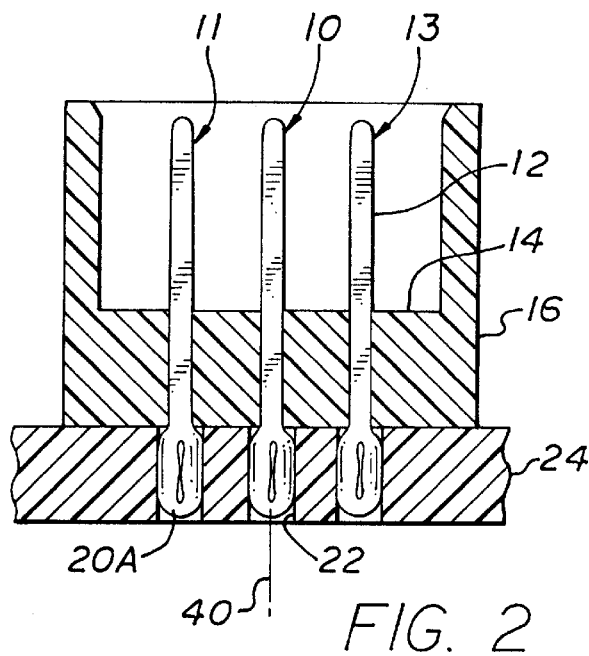
FIG. 2
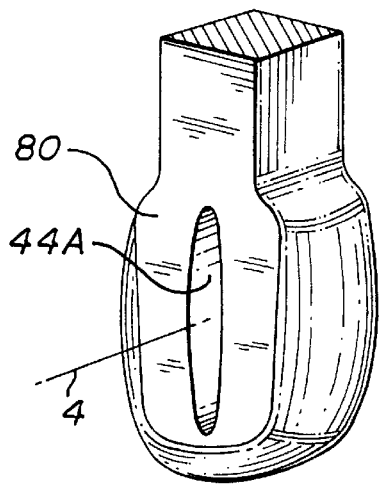
FIG. 3
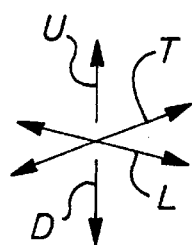
FIG. 8
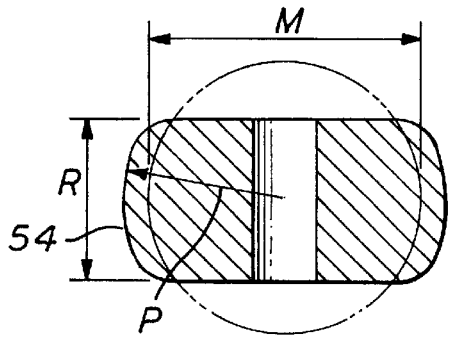
FIG. 7
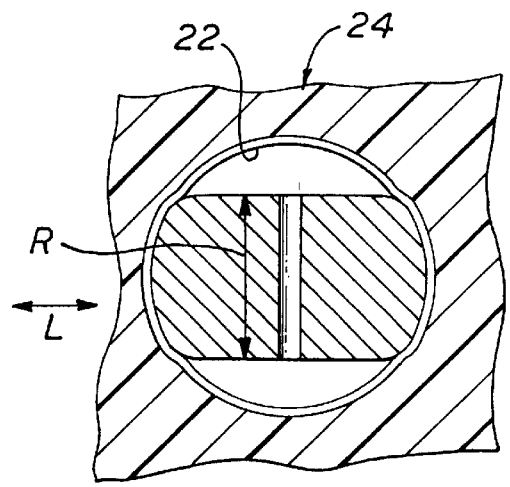

5,823,830

TAILESS COMPLIANT CONTACT

BACKGROUND OF THE INVENTION

Electrical contacts such as those projecting from a connector housing for insertion into circuit board holes, are commonly provided with compliant sections which resist pullout from the holes. One type of compliant section is the eye-of-the-needle type which has an elongated vertical slot that divides the section into a pair of beams. A lower portion of the contact lying below the slot, generally projects below the lower face of the circuit board. This projecting part may radiate or receive high frequency signals, which has the disadvantage that it produces crosstalk between contacts (a portion of the signal on one contact is radiated to an adjacent one), and that stray electromagnetic energy may be induced in the contact. Contacts that could be constructed to minimize the transmission and reception of high frequency electromagnetic radiation, while providing a high retention force, would be of value.

SUMMARY OF THE INVENTION

In accordance with one embodiment of the present invention, an electrical contact and a combination of a contact with a circuit board are provided, which minimize high frequency electromagnetic emission and reception by the contact portion that lies in or below the circuit board. The contact has a compliant section of the eye-of-the-needle type that has a vertical slot, a pair of beams on either side of the slot, and a lower portion lying below the slot. The lower portion extending below the bottom of the slot, has a small height so it projects minimally or not at all below the bottom of the circuit board. The bottom of the contact is rounded to a large radius of curvature for minimal transmission and reception. The outer sides of the arms are convexly rounded to a large radius of curvature, for large area contact with the walls of the circuit board hole.

The novel features of the invention are set forth with particularity in the appended claims. The invention will be best understood from the following description when read in conjunction with the accompanying drawings.

BRIEF DESCRIPTION OF THE DRAWINGS

FIG. 1 is a sectional view of prior art eye-of-the-needle contacts shown extending from a connector and press-fit in a circuit board.

FIG. 2 is a sectional view of electrical contacts of the present invention, shown mounted in a connector and projecting into a circuit board.

FIG. 3 is an isometric view of a portion of an electrical contact of FIG. 2, but shown in its initial configuration.

FIG. 7 is a view taken on the line 7—7 of FIG. 6.

FIG. 8 is a view similar to that of FIG. 7, but showing the contact compliant section fully installed in a circuit board hole.

DESCRIPTION OF THE PREFERRED EMBODIMENT

Figure 4:
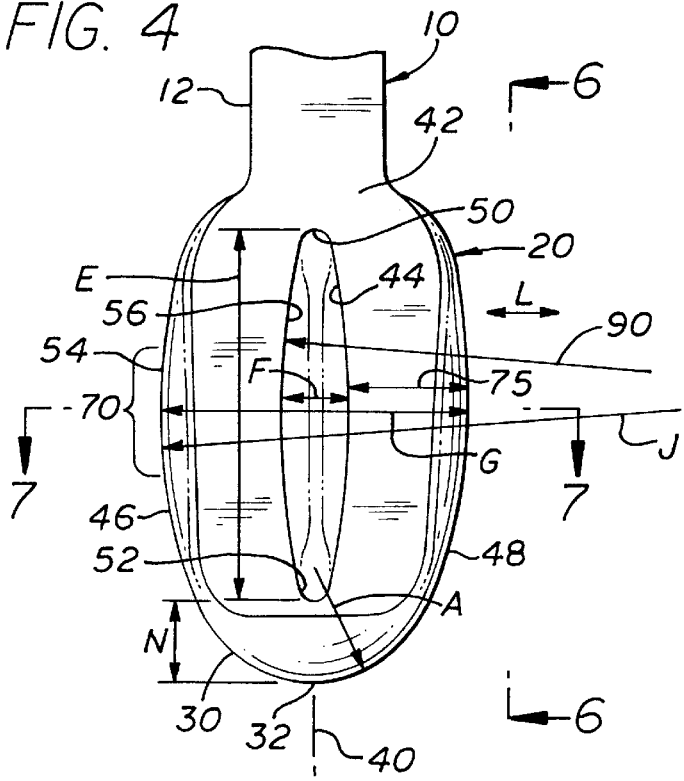
FIG. 4 is a front elevation view of a portion of the contact of FIG. 3, taken along a line extending along the thickness dimension, with FIG. 4 showing the contact in its initial configuration.

FIG. 1 illustrates prior art electrical contacts S which had pin-like top sections U' fixed to a board V of a connector W, and having compliant sections X lying in interference or press-fit with holes of a circuit board Y. Even when no bottom section was required to extend below the lower face of the circuit board, the contacts often had projecting lower sections Z for ease of manufacture. The lower sections Z had sharp corners, as at SS, which can act as antennas for high frequency signals, such as those of a frequency on the order of 100 MHz and higher. Also, it can be seen that the region immediately below the circuit board Y and between the contacts, is unobstructed to the passage of electromagnetic energy. As a result, when such high frequency signals passed through the contacts, as between the top section S and conductive traces on the circuit board that were connected to the compliant section X, some of that signal energy was radiated from the sharp edge SS of one contact, and received at the sharp edge of adjacent contacts. This resulted in "crosstalk" wherein some of the signal passing through one contact was picked up by an adjacent contact, which is highly undesirable. The projecting sharp edges SS also could radiate signals to adjacent circuitry and pick up stray signals.

FIG. 2 shows electrical contacts 10, 11, 13 of the present invention, which have pin-like top sections 12 held in a board part 14 of a connector housing 16, and which have compliant sections 20A lying in press fits within holes 22 of a circuit board 24. For the particular arrangement of FIG. 2, the contact 10 is the center conductor of a coaxial coupling, with contacts 11, 13 being the grounded outer conductor. Portion of contacts 11, 13 above the circuit board can merge into a cylinder.

Figure 5:
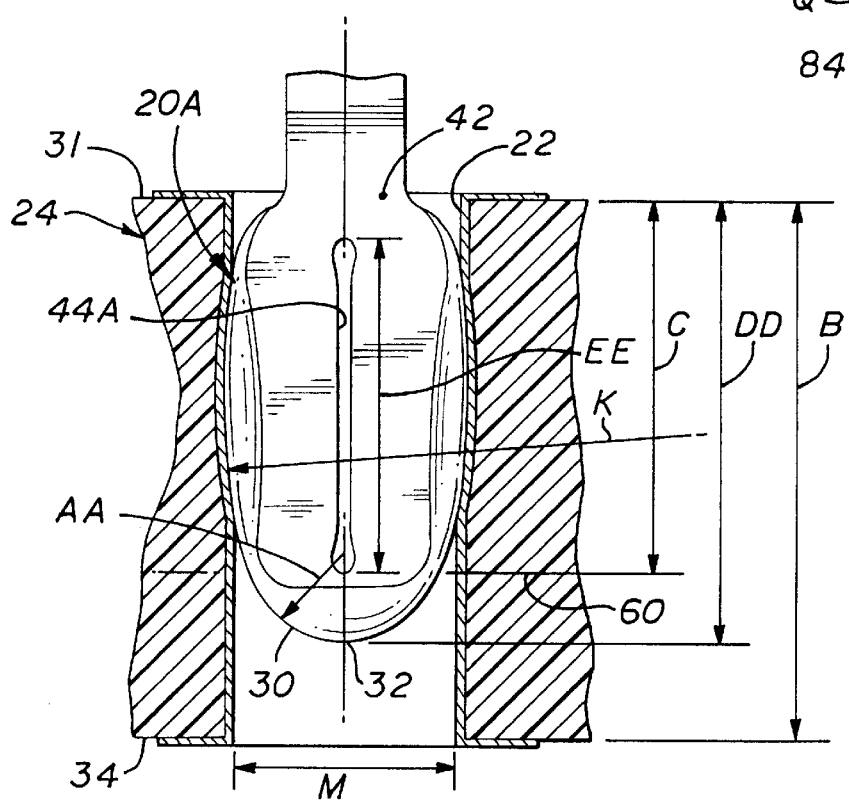
FIG. 5 is a front elevation view of a portion of a contact shown in its press-fit configuration in a circuit board hole.

FIG. 5 is an enlarged view of the compliant section 20A of the contact shown press fit in the circuit board. The compliant section has a lower portion 30 which is rounded at a relatively large radius of curvature A (FIG. 4) and which has a low height N. As a result, the extreme lower end 32 lies even with or above the lower face 34 of a circuit board of moderate vertical height B.

FIG. 4 shows the compliant section 20 in its initial configuration, as seen along line 4 of FIG. 3, which the compliant section assumes prior to insertion into a circuit board hole. The compliant section has a vertical axis 40 and has upper and lower ends 42, 32, with the top section 12 generally being of uniform width and extending up from the upper end. The compliant section has a vertically-extending slot 44 that extends through the entire thickness of the compliant section, and that leaves a pair of largely vertical beams 46, 48. The beams have upper ends that merge at the upper end 50 of the slot and have lower ends that merge at the lower end 52 of the slot, so that the beams can be considered to have a height equal to that of the slot. Each beam such as the first one 46 has an outer side 54 which is furthest from the slot, and an inner side 56 which is nearest to and which forms one side of the slot. In the initial configuration of the contact shown in FIG. 4, which is its configuration prior to insertion into the circuit board, both the outer and inner sides 54, 56 of each beam are curved, with the outer side 54 being convex and the inner side 56 being concave. It should be noted that the compliant section is symmetrical about its axis 40.

When the compliant section 20 of the initial configuration of FIG. 4 is force fit by pressing it downwardly into the plated circuit board hole, the walls of the hole press the beams closer together, while the beams deflect closer together. The compliant section 20 is designed for insertion into holes of a predetermined diameter, such as 0.040 inch (1.0 mm), although the diameter may vary between 37 mils (1 mil equals one thousandth inch) and 43 mils (i.e. from 0.9 mm to 1.1 mm). The amount of compliant section deformation depends upon the precise diameter of the hole, as well as the precise size of the contact compliant section (whose maximum width may vary by perhaps plus or minus 2 mils).

The most common circuit board heights or thicknesses, are 125 mils (3.2 mm), 94 mils (2.4 mm) and 62 mils (1.6 mm, which has more recently become popular). FIG. 5 shows the deformed compliant section 20A in a circuit board of height B of 94 mils, while line 60 indicates the bottom of a circuit board of a height C of 62 mils. The upper end 42 of the compliant section preferably lies even with the board upper face 31. For the thicker board of height B, the extreme lower end 32 of the compliant section does not project below the board lower face 34, which avoids crosstalk between adjacent contacts. For the thinner board of height C the lower part 30 projects below the lower surface 60 of the board, and therefore may emit and receive signals from adjacent contacts and produce crosstalk. The rounding at radius A (FIG. 4) of the projecting lower part 30 results in minimal emission and reception of crosstalk signals. Also, the rounding minimizes emission and reception of signals with respect to components lying below the circuit board. It would be possible to avoid any projection of the compliant section below even the thinnest circuit board, by making the compliant section of smaller height. However, it is desirable for all board sizes, that the height DD of the compliant section be more than half the height (or vertical thickness) of the circuit board, in order that the height EE of the slot 44 and of the beams be at least one-half the total height of the board, to provide a large retention force (resistance to pullout) for the contact.

Applicant has constructed and successfully tested contacts of an initial configuration shown in FIG. 4. The slot 44 had a height E of 63 mils (1.6 mm) and an initial width F of 10 mils (0.25 mm). The maximum lateral width in the lateral direction L, of the beams at the middle of their heights, was a distance G of 48 mils (1.2 mm). The lower part 30 was formed with a radius of curvature A of 18 mils. It is desirable that the radius of curvature A (or at AA after press fit) of the lower part 30 (which lies below the slot lower end 52) be at least twenty percent of the maximum lateral width G of the contact, to minimize emissions and pickups of high frequency electromagnetic signals. The radius A will decrease only slightly when the contact is press fit into the circuit board.

It is desirable that the outer side 54 of each beam be convexly curved, but with a moderately large radius of curvature J, which is preferably greater than the maximum lateral width G but not more than ten times G. As shown in FIG. 5, the radius of curvature will increase to an amount K after the compliant section is force fit into the circuit board hole, but the initial convexity will result in a large area of contact between the beam sides and the walls of the circuit board hole. Such large area of contact results in a large retention force that resists pullout of the contact. In the contact illustrated, the initial radius of curvature J was 86 mm, for use in a circuit board hole 22 of nominal width M of 40 mils. The radius of curvature of the beam outer side 54 may vary along its height, but the above radius J applies at least to a middle portion 70 which occupies one-third of the height E of the slot and of the beams. The extreme lower end 32 of the compliant section lies only a small distance N of 12 mils (0.3 mm) below the bottom of the slot, with the distance N preferably being no more than twenty-five percent of the height E of the slot, and preferably being less than the maximum width 75 of each beam.

The inner side 56 (FIG. 4) of each beam has a radius of curvature 90 which is larger than the radius of curvature J of the outer side 54 of the beam, at least along the middle portion 70, and preferably along almost the entire height of the beam. This results in the beam being progressively thicker at locations progressively closer to the middle of the height of the slot. The particular radius of curvature at 90 was 122 mils, which is greater than the radius of curvature J of the 86 mils. The strength of a beam is proportional to the square of its width, while the rigidity of a beam is proportional to the cube of its width. Thus, a small increase in beam width towards the center provides a considerable increase in beam stiffness, to provide a large holding power in the circuit board hole. The gradual change in thickness helps assure large area contact of the beam outer surface with walls of the hole.

Figure 6:
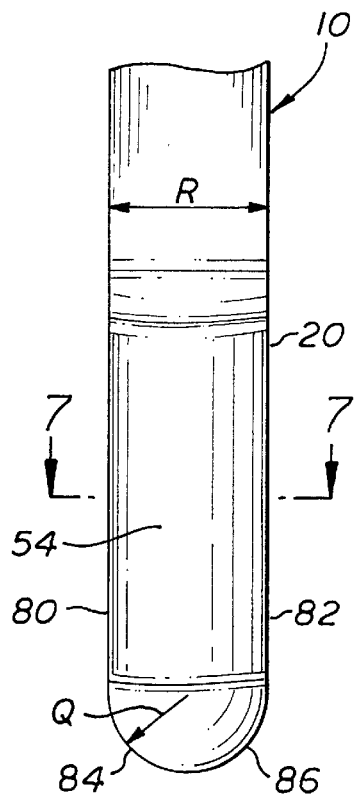
FIG. 6 is a view taken on the line 6—6 of FIG. 4.

FIG. 6 is a side elevation view of the contact 10 in its initial configuration, which shows that the contact is formed of sheet metal so it is of uniform thickness. However, the lower ends of the front and rear faces 80, 82 are rounded to form rounded front and rear lower ends 84, 86 which are each rounded at a large radius of curvature Q which is preferably at least one-quarter of the thickness R of the contact. At least half of the area of each face is left flat.

FIG. 7 compares the cross section of the middle of the compliant section, taken on line 7—7 of FIG. 6 in the initial configuration of the contact, and compares it to the diameter M of the circuit board hole. FIG. 8 shows the contact in its press-fit configuration after insertion into the circuit board hole 22. It is desirable that the thickness R of the contact be between one-half and three quarters of the nominal hole diameter M. A thinner contact would result in beams of less strength and smaller area of contact with the circuit board holes, resulting in smaller retention force. Applicant has constructed and tested contacts of 16 mils, thickness (40% of hole diameter), and found them satisfactory only where a lower retension force is acceptable. A thicker contact (more than ¾ hole diameter) is not likely to substantially increase the holding power, since the force of the beams is in the lateral direction L. Also, where a contact is made of sheet metal, it is more difficult to round the outer sides of a thicker contact. It can be seen in FIG. 7, that the outer side 54 of each contact has a radius of curvature P which is approximately equal to the radius of the circuit board hole M.

FIG. 3 is an isometric view of the compliant section, showing the lateral direction L, the thickness direction T and the vertical up and down directions U, D.

To construct the contact, applicant uses a piece of sheet metal of appropriate material such as phosphor bronze, which is of relatively low cost and easy to form. A piece of the material is punched out of the sheet, the opposite sides and bottom portion are rounded by other dies, and the piece is laterally deformed to the width shown in FIG. 4 to result in the initial contact configuration of FIG. 4. The contact of FIG. 4 is ready for insertion into a circuit board hole.

Applicant has designed, made, and tested ten different contacts to achieve minimum antenna characteristics and high retention force. The design shown, of the dimensions given above, was found best. When inserted in holes of nominally 40 mils (1 mm) diameter, it produced a retention force of at least 7.5 pounds (3.3 kg.), while having minimal antenna characteristics.

While terms such as "vertical," "height," etc. have been used to aid in the description of the invention as illustrated, it should be understood that the parts can be used in any orientation with respect to Earth's gravity.

Thus, the invention provides an electrical contact with a large retention force, which minimizes the emission and reception of high frequency signals when installed in circuit board holes, especially those of the most common sizes. Emission and reception resulting in crosstalk, is minimized by rounding the lower surface of the contact, and by constructing the compliant section so the portion below the bottom of the slot is short so it does not project below the bottom of most circuit boards and projects minimally below the bottom of thin boards. This is accomplished while maintaining a high retention force, by making the beams of a length that is at least half the board thickness and by providing the outer sides of the beam with convex surfaces of moderately large radius of curvature.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electrical contact which has a compliant section with a vertical axis and upper and lower ends, for press-fit into a hole of a board, and which has a top section extending generally upwardly from said upper end of said compliant section, wherein said compliant section has lateral and thickness dimensions that are perpendicular to each other and to said vertical axis, and wherein said compliant section is of the eye-of-the-needle type that includes a vertically-extending slot that extends through the entire thickness of said compliant section and that leaves a pair of largely vertical beams that have merging upper and lower ends and laterally spaced beam middle portions, with said beam middle portions having inner sides at said slot and having outer sides that lie furthest from said slot and with said compliant section having a predetermined maximum lateral spacing of said outer sides, with said compliant section having an extreme lower end that forms an extreme lower end of said contact, and wherein said contact has an initial configuration prior to said press-fit, characterized by:

in said initial configuration, said lower end of said compliant section is convexly rounded, as seen in a front elevation view taken along a line extending along said thickness dimension, with said lower end extending downwardly of said slot and with said lower end, including said extreme lower end of said compliant section, having a radius of curvature (A) that is at least 20% of said predetermined maximum lateral spacing, as seen in said front elevation view, with said compliant section having a maximum thickness (R) and with said lower end of said compliant section including said extreme lower end thereof also being convexly rounded to have a radius of curvature (Q) that is at least 25% of the thickness of said compliant section as seen in a side elevation view.

2. The contact described in claim 1 wherein:

the extreme lower end of said contact lies a distance N below the bottom of said slot, where said distance is no more than one-quarter of the height E of said slot.

3. The contact described in claim 1 including:

a circuit board of predetermined thickness, which has a plated cylindrical through board hole and which has upper and lower faces, said circuit board lower face being unobstructed to the passage of electromagnetic radiation immediately below said board hole;

said compliant section of said contact lies in said board hole, with said lower end of said compliant section which forms the bottom of said contact, lying at least as high as the lower face of said board.

4. A combination of a circuit board which has upper and lower faces and a plurality of plated holes extending along a vertical axis through said board, and a plurality of electrical contacts that each has a compliant section lying in interference fit in one of said holes and a top section projecting generally upwardly above the hole, where the compliant section of each contact is of the eye-of-the-needle type with a vertically-elongated slot that forms a pair of laterally-spaced beams, and where a region lying immediately below said circuit board and between first and second of said holes is unobstructed to the passage of electromagnetic energy, wherein:

said first and second contacts each have convexly gradually rounded lower end means for minimizing radiation and reception of electromagnetic energy, said rounded lower end means forming the lower ends of said contacts and being rounded as seen in both a front elevation view and a side elevation view, with said views taken along lines that are perpendicular to each other and that are both perpendicular to said axis.

5. The combination described in claim 4 wherein:

said contacts are each formed of sheet metal with front and rear faces having primarily parallel flat portions as seen in a side elevation view, and said rounded lower end means each has a radius of curvature (Q), as seen in a side elevation view, which is at least one-quarter of the thickness (R) between said flat portions.

6. The combination described in claim 4 wherein:

said contacts each have extreme lower ends spaced a distance (N) below the bottom of the slot of the contact, where the distance (N) is no more than one-quarter the height (E) of the slot of the contact.

7. An electrical contact which has a compliant section with a vertical axis and upper and lower ends, for press-fit into a hole of a board, said contact having a top section extending generally upwardly from said upper end of said compliant section, wherein said compliant section has lateral and thickness dimensions that are perpendicular to each other and to said vertical axis, and wherein said compliant section is of the eye-of-the-needle type that includes a vertically-extending slot that extends through the entire thickness of said compliant section and that has upper and lower slot ends and that leaves a pair of largely vertical beams that have merging upper and lower beam ends and laterally spaced beam middle portions, said compliant section lower end forming the lower end of said contact, and wherein said contact has an initial configuration prior to said press-fit, characterized by:

in said initial configuration, said lower end of said compliant section is rounded and extends below the lower end of said slot by a maximum distance (N) that is no more than 25% of the height (E) of said slot.

8. The combination described in claim 7 wherein:

said beam middle portions have outer sides spaced by a predetermined distance (G) of about 0.048 inch, and said lower end of said compliant section extends a distance (N) of about 0.012 inch below said slot lower end.

* * * * *